United States Patent
Yamamoto

(10) Patent No.: US 11,062,864 B2
(45) Date of Patent: Jul. 13, 2021

(54) CIRCUIT PROTECTION ELEMENT

(71) Applicant: BOURNS KK, Osaka (JP)

(72) Inventor: Kohei Yamamoto, Osaka (JP)

(73) Assignee: BOURNS KK, Osaka (JP)

(*) Notice: Subject to any disclaimer, the term of this patent is extended or adjusted under 35 U.S.C. 154(b) by 0 days.

(21) Appl. No.: 16/969,782

(22) PCT Filed: Feb. 14, 2019

(86) PCT No.: PCT/JP2019/005311
§ 371 (c)(1),
(2) Date: Aug. 13, 2020

(87) PCT Pub. No.: WO2019/160028
PCT Pub. Date: Aug. 22, 2019

(65) Prior Publication Data
US 2020/0411264 A1    Dec. 31, 2020

(30) Foreign Application Priority Data
Feb. 16, 2018  (JP) .............................. JP2018-026318

(51) Int. Cl.
*H01H 37/76*    (2006.01)
*H05K 1/02*    (2006.01)
*H05K 3/34*    (2006.01)

(52) U.S. Cl.
CPC ......... *H01H 37/761* (2013.01); *H05K 1/0201* (2013.01); *H05K 1/0263* (2013.01); *H05K 3/341* (2013.01)

(58) Field of Classification Search
CPC .. H01H 37/761; H05K 1/0201; H05K 1/0263; H05K 3/341; H05K 1/18; H05K 37/76
(Continued)

(56) References Cited

U.S. PATENT DOCUMENTS 2,921,167 A * 1/1960 Dahlen ................. H01H 85/36
                                                    337/181
5,192,937 A * 3/1993 Lee ....................... H01C 1/084
                                                    337/104
(Continued)

FOREIGN PATENT DOCUMENTS

DE    102016213019 B3 * 12/2017  ........... H01H 85/143
JP    2009-289507 A    12/2009
(Continued)

OTHER PUBLICATIONS

International Search Report for corresponding Application No. PCT/JP2019/005311, dated Apr. 9, 2019.

*Primary Examiner* — Anatoly Vortman
(74) *Attorney, Agent, or Firm* — Renner, Otto, Boisselle & Sklar, LLP

(57) ABSTRACT

A circuit protection element includes a first leg part formed by being bent once from a first end part of a ceiling part that is the bending reference plane; a second leg part formed by being bent once with respect to the bending reference plane; a first mounting part and a second mounting part each formed by being bent twice with respect to the bending reference plane so as to be flush mutually and parallel to a mounting surface of the circuit board; and a plastic deformation part (a curved part) set in a predetermined region of the second leg part and plastically deformed by applying a load in the vicinity of a second end part of the ceiling part toward the mounting surface of the circuit board.

9 Claims, 14 Drawing Sheets

(58) Field of Classification Search
USPC .......................................................... 337/401
See application file for complete search history.

(56) References Cited

U.S. PATENT DOCUMENTS

| | | | | |
|---|---|---|---|---|
| 5,280,262 | A * | 1/1994 | Fischer | H01H 37/761 337/402 |
| 5,563,570 | A * | 10/1996 | Lee | H01C 1/084 310/68 C |
| 5,600,295 | A * | 2/1997 | Kaufmann | H01H 37/761 337/402 |
| 5,612,662 | A * | 3/1997 | Drekmeier | H01H 37/761 29/623 |
| 5,770,993 | A * | 6/1998 | Miyazawa | H01C 7/13 337/142 |
| 5,896,080 | A * | 4/1999 | Chen | H05K 1/0201 337/407 |
| 7,002,785 | B1 * | 2/2006 | Bothe | H01H 37/76 361/103 |
| 7,023,674 | B2 * | 4/2006 | Gross | H01H 37/761 337/407 |
| 7,864,024 | B2 * | 1/2011 | Schlenker | H01H 37/761 337/407 |
| 8,665,057 | B2 * | 3/2014 | Schlenker | H05K 1/0201 337/407 |
| 8,749,940 | B2 * | 6/2014 | Schmidtlein | H05K 3/3426 361/103 |
| 9,620,321 | B2 * | 4/2017 | Storzinger | H01H 85/36 |
| 10,151,292 | B2 * | 12/2018 | Vogelbacher | H05K 1/0201 |
| 10,217,594 | B2 * | 2/2019 | Lee | H01H 85/08 |
| 10,714,287 | B2 * | 7/2020 | Bass | H05K 1/0263 |
| 10,784,067 | B2 * | 9/2020 | Markert | H05K 3/222 |
| 2009/0027156 | A1 * | 1/2009 | Schlenker | H01H 37/761 337/404 |
| 2014/0232511 | A1 * | 8/2014 | Durth | H05K 1/0201 337/180 |
| 2019/0148099 | A1 | 5/2019 | Markert | |

FOREIGN PATENT DOCUMENTS

| | | |
|---|---|---|
| KR | 10-1505865 B1 | 3/2015 |
| WO | 2018/011195 A1 | 7/2017 |

* cited by examiner

CIRCUIT PROTECTION ELEMENT

TECHNICAL FIELD

The present invention relates to a circuit protection element mounted on a circuit board, and particularly the present invention relates to a circuit protection element that separates from the circuit board, thereby interrupting current, when the temperature near the surface of the circuit board reaches a temperature equal to or higher than the melting temperature of solder due to abnormal heat generation of an electronic component mounted on the circuit board.

BACKGROUND ART

A general breaker, electrically connected to an electric circuit formed on a circuit board, is arranged to break a current flowing in the electric circuit when an overcurrent flows in the electric circuit, following the processes in the braker: a heat-generating element therein generates heat due to the overcurrent; the heat causes a heat-responsive element to operate and deform a movable piece; and a movable-contact provided at a free end of the movable piece separates from a fixed-contact provided on a fixed piece to break the current by cutting off the flow. On the other hand, in Patent Document 1, a circuit protection element is proposed, which is mounted on a circuit board near an electronic component such as an IC on the circuit board, and separates from the circuit board to break and interrupt an electric current, when the electronic component abnormally generates heat due to a failure, etc., and the temperature near the surface of the circuit board reaches a temperature equal to or higher than the melting temperature of solder used to mount the element.

FIGS. 14A to 14C show a first configuration example of a circuit protection element described in Patent Document 1: FIG. 14A shows a state in which the circuit protection element 110 is formed by bending a metal plate by pressing, etc.; FIG. 14B shows a state in which the circuit protection element 110 is mounted on the circuit board 150; and FIG. 14C shows a state in which solder is melted and the circuit protection element 110 is separated from the circuit board 150. The circuit protection element 110 in a state mounted on the circuit board 150 comprises: the ceiling part 111 that is substantially parallel to a mounting surface of the circuit board 150; the first leg part 112 and the second leg part 113 that are substantially perpendicular to the mounting surface of the circuit board 150; the first mounting part 114 that is soldered to the first conductive pad 151 and second conductive pad 152 formed on the mounting surface of the circuit board 150; the second mounting part 115 that is soldered to the third conductive pad 153 formed on the mounting surface of the circuit board 150; and the contact part 116 that directly contacts the mounting surface of the circuit board 150.

As shown in FIG. 14A, the circuit protection element 110 has a relatively simple cross-sectional shape, but in a state immediately after metal processing, the first mounting part 114 and the second mounting part 115 are not flush with each other, and the first mounting part 114 is inclined with respect to the second mounting part 115. Then, as shown in FIG. 14B, the circuit protection element 110 must be mounted on the circuit board 150 so that the first mounting part 114 and the second mounting part 115 become flush with each other. At this time, an elastic deformation part formed by the ceiling part 111, the first leg part 112, and the second leg part 113 is deformed, and stress is purposely accumulated in the circuit protection element 110. Then, when the temperature near the surface of the circuit board reaches a temperature equal to or higher than the melting temperature of the solder due to abnormal heat generation by an electronic component or the like, the solder, connecting the first mounting part 114 and the second mounting part 115, respectively, to the first conductive pad 151 and second conductive pad 152, and the third conductive pad 153, is softened or melted, and the fixing of the first mounting part 114 and second mounting part 115 by soldering is released. Along with this, the stress accumulated in the circuit protection element 110 is released, the elastic deformation part of the circuit protection element 110 moves to return to the original shape, and the first mounting part 114 side jumps up, and thus the first mounting part 114 separates from the first conductive pad 151 and second conductive pad 152, and then the electric current flowing through the electric circuit between the first conductive pad 151 and the second conductive pad 152 is interrupted. As a result, the supply of electric power to the electronic component is stopped, and abnormal heat generation of the electronic component is eliminated. Although the solder fixing the second mounting part 115 to the third conductive pad 153 also melts substantially at the same time, because the contact part 116 is formed continuously with the second mounting part 115, the contact part 116 serves as a stopper to prevent the second mounting part 115 side from jumping up due to the stress accumulated inside the circuit protection element 110.

FIGS. 15A to 15C show a second configuration example of the circuit protection element described in Patent Document 1: FIG. 15A shows a state in which the circuit protection element 120 is mounted on the circuit board 150; FIG. 15B shows a state in which the protection element 120 mounted on the circuit board 150 is deformed; and FIG. 15C shows a state in which solder is melted and the circuit protection element 120 is separated from the circuit board 150. The circuit protection element 120, in a state after being mounted on the circuit board 150 and before being deformed, comprises: the ceiling part 121 that is substantially parallel to the mounting surface of the circuit board 150; the first leg part 122 that is substantially perpendicular to the mounting surface of the circuit board 150; the second leg part 123 that is crank-shaped; the first mounting part 124 that is soldered to the first conductive pad 151 and second conductive pad 152 formed on the mounting surface of the circuit board 150; the second mounting part 125 that is soldered to the third conductive pad 153 formed on the mounting surface of the circuit board 150; and the hook part 126 that is fitted into the hole 154 formed in the mounting surface of the circuit board 150. The crank-shaped second leg part 123 further comprises: the first vertical part 123a located on a side farther from the first leg part 122; the second vertical part 123b located on a side closer to the first leg part 122; and the inclined part 123c located between the first vertical part 123a and the second vertical part 123b.

As shown in FIG. 15A, since the circuit protection element 120 of the second configuration example has no stress accumulated therein when mounted on the circuit board 150, as shown in FIG. 15B, the second leg 123 is plastically deformed by applying a force to the vicinity of the bent part 121a between the ceiling part 121 and the second leg part 123 in a direction substantially perpendicular to the mounting surface of the circuit board 150. Thereby, the ceiling part 121, the first leg part 122 and the like are elastically deformed, and stress is accumulated in those parts. Then, when the temperature near the surface of the circuit board reaches a temperature equal to or higher than the melting temperature of the solder due to abnormal heat generation of the electronic component, the solder is softened or melted in the same manner as described above, and the fixing of the first mounting part 124 with solder is released. Along with that, the stress accumulated in the circuit protection element 120 is released, and the elastically deformed part of the circuit protection element 120 moves to return to the original shape, and the first mounting part 124 side jumps up, and thus the first mounting part 124 separates from the first conductive pad 151 and the second conductive pad 152, and then the electric circuit between the first conductive pad 151 and the second conductive pad 152 is interrupted. Since the hook part 126 is fitted in the hole 154 formed in the circuit board 150 and is locked in the hole 154 by the elasticity of the hook part 126, the second mounting part 125 side is prevented from jumping up.

PRIOR ART DOCUMENTS, PATENT DOCUMENTS

Patent Document 1: U.S. Pat. No. 8,665,057

DISCLOSURE OF THE INVENTION

In general, when a metal plate is punched out by press-working and formed into a desired shape by being bent, and thereby its multiple different parts are made flush mutually, it is desirable to reduce the number of times of the bending. In particular, in the case of a component mounted on a portable electronic device or the like, the metal plate to be processed has a small thickness and the component itself has a very small size. Therefore, the allowable dimensional tolerance is very small, and it is substantially impossible to make a plurality of different parts flush with each other, when the number of times of the bending is 3 times or more for mass-produced elements formed by the bending and press-working.

In the circuit protection element 110 according to the first configuration example described in Patent Document 1, the first mounting part 114 and the second mounting part 115 are each formed by being bent twice with respect to the ceiling part 111 serving as a bending reference plane, however, in the state immediately after processing, the first mounting part 114 and the second mounting part 115 are not flush with each other, and the first mounting part 114 is inclined with respect to the second mounting part 115. Therefore, when the circuit protection element 110 is mounted on the circuit board 150, the first mounting part 114 must be pressed so as to be parallel to the mounting surface. Therefore, so-called reflow soldering, in which the solder paste is applied on the conductive pads in advance and the circuit board is heated, cannot be used and the manufacturing process becomes complicated. Further, in the circuit protection element 110 having a small thickness and a small size, it is difficult to keep the inclination angle of the first mounting part 114 with respect to the second mounting part 115 within allowable dimensional tolerance, and thus the variation of the stresses accumulated in the circuit protection elements 110 manufactured by mass-production becomes large. Therefore, there is a risk that the circuit protection element 110 does not function sufficiently and the current flow may not be cut off, when inclination angle of the first mounting part 114 with respect to the second mounting part 115 is small and so the stress accumulated in the circuit protection element 110 is too small.

In the circuit protection element 120 according to the second configuration example described in Patent Document 1, the first mounting part 124 is formed by being bent twice, with respect to the ceiling part 121 used as a bending reference plane, but the second mounting part 125 is formed by being bent four times. Further, even when the first vertical part 123a of the second leg part 123 is used as the bending reference plane, the first mounting part 124 and the second mounting part 125 are each formed by being bent three times. Therefore, when the circuit protection element 120 is mass-produced by press-working, it is practically impossible to make the first mounting part 124 and the second mounting part 125 flush with each other, and when the circuit protection element 120 is mounted on the circuit board 150, there is a risk that soldering failure may occur, and reflow soldering cannot be practically used.

The present invention has been made in order to solve the above-mentioned problems of the conventional example, and the object of the present invention is to provide a circuit protection element in which a plurality of mounting parts, to be mounted on a circuit board, can be formed flush with each other by being bent twice with respect to a bending reference plane via processing with punching and press-working a metal plate.

In order to attain the above-mentioned subject, the circuit protection element of the present invention is formed by bending a metal plate and used in a state plastically deformed after being mounted on a circuit board, and comprises:

a ceiling part serving as a bending reference plane during forming;

a first leg part formed by being bent, from a first end part of the ceiling part, once with respect to the bending reference plane;

a first mounting part formed by being bent, from the first leg part so as to be parallel to the ceiling part, twice with respect to the bending reference plane:

a second leg part formed by being bent, from an end part, different from the first end part, of the ceiling part, once with respect to the bending reference plane;

a second mounting part formed by being bent, from the second leg part so as to be parallel to the ceiling part, twice with respect to the bending reference plane: and a plastic deformation part set in a predetermined part of the second leg part so as to be plastically deformed by applying a load in the vicinity of a second end part opposite to the first end part, in a longitudinal direction of the circuit protection element, of the ceiling part toward a mounting surface of the circuit board.

The circuit protection element may further comprises a reinforcing part for increasing rigidity of a part of the second leg part other than the predetermined part.

The circuit protection element may further comprises a reinforcing part for maintaining parallelism and/or flatness of the second mounting part with respect to the mounting surface of the circuit board.

In the circuit protection element, the second leg part may consist of a pair of leg parts formed by bending, inward in the width direction of the circuit protection element, a part extending in the width direction from the ceiling part, symmetrically with respect to a center line of a width of the circuit protection element.

Or, in the circuit protection element, the second leg part may consist of a pair of leg parts formed by bending, inward in the longitudinal direction of the circuit protection element, a part extending in the longitudinal direction from the ceiling part, symmetrically with respect to a center line of a width of the circuit protection element.

In the circuit protection element, a cutout may be formed in the vicinity of the predetermined part of each of a pair of the second legs.

The circuit protection element may further comprises an auxiliary leg part bent from the vicinity of the second end part of the ceiling part toward the mounting surface side of the circuit board.

In the circuit protection element, a contact part contacting the mounting surface of the circuit board or a hook part engaging with a locking hole formed in the circuit board may be formed at an end part of the auxiliary leg part, wherein the end part is on a side near to the mounting surface of the circuit board.

In the circuit protection element, a self-locking part to be engaged with a predetermined part of the circuit protection element may be formed at an end part of the auxiliary leg part, wherein the end part is on a side near to the mounting surface of the circuit board.

According to the above configuration, since the first mounting part and the second mounting part, which are mounted on conductive pads on a mounting surface of the circuit board when the circuit protection element is mounted on the circuit board, are formed each by bending only twice the metal plate with respective to the ceiling part serving as the bending reference plane, it is possible to keep the dimensional error in the height direction of the circuit protection element with respect to the bending reference plane within a certain allowable range, and possible to make the first mounting part and the second mounting part substantially flush with each other. Therefore, the circuit protection element can be mounted on the circuit board at the same time as mounting other electronic components by reflow soldering. And then, after the circuit protection element is mounted on the circuit board, the plastic deformation part, set on the second leg part of the circuit protection element, is plastically deformed by applying a load to the vicinity of the second end part of the ceiling part and pressing the part strongly toward the circuit board. At this time, the parts other than the plastic deformation part are elastically deformed, and elastic stress is accumulated in the circuit protection element. This state is a normal use state of the circuit protection element.

If an electronic component such as an IC mounted on the circuit board abnormally generates heat due to a failure or the like and the temperature near the surface of the circuit board reaches the melting temperature of the solder or higher, the solder, which fixes the first mounting part and the second mounting part to the conductive pads on the mounting surface of the circuit board, is softened or melted, and the fixing of the first mounting part and the second mounting part by the solder is released, and the stress accumulated in the ceiling part and the first leg, etc. is released, and these elastically deformed parts move to return to their original shapes. Originally, the first mounting part is substantially parallel to the ceiling part, but since the ceiling part is inclined with respect to the mounting surface of the circuit board due to the plastic deformation of the second leg part, the first mounting part also tends to incline with respect to the mounting surface of the circuit board and the first leg is flipped up in a direction away from the mounting surface of the circuit board. Then, when the first mounting part is completely separated from the conductive pad, the electric circuit is cut off and the power supply to electronic components is stopped.

BRIEF DESCRIPTION OF THE DRAWINGS

FIG. 5A is a plan view; FIG. 5B is a side view; and FIG. 5C is a front view.

FIG. 6A is a side view showing the circuit protection element in a state after mounted on the circuit board and before plastically deformed; and FIG. 6B is a side view showing the circuit protection element in a state after plastically deformed.

FIG. 7A is a side view showing the circuit protection element in a state after mounted on the circuit board and before plastically deformed; and FIG. 7B is a side view showing the circuit protection element in a state after plastically deformed.

FIG. 11A is a plan view; FIG. 11B is a side view; and FIG. 11C is a front view.

FIG. 12A is a side view showing the circuit protection element in a state after mounted on the circuit board and before plastically deformed; and FIG. 12B is a side view showing the circuit protection element in a state after plastically deformed.

FIG. 13A is a side view showing the circuit protection element in a state after mounted on the circuit board and before plastically deformed; and FIG. 13B is a side view showing the circuit protection element in a state after plastically deformed.

FIG. 14A shows the circuit protection element in a state after bending process of a metal plate by press working etc.; FIG. 14B shows the circuit protection element in a state mounted on a circuit board; and FIG. 14C shows the circuit protection element in a state separated from the circuit board after solder is melted.

FIG. 15A shows the circuit protection element in a state mounted on a circuit board; FIG. 15B shows the circuit protection element in a state deformed after mounted on the circuit board; and FIG. 15C shows the circuit protection element in a state separated from the circuit board after solder is melted.

MODE FOR CARRYING OUT THE INVENTION

Figure 1:
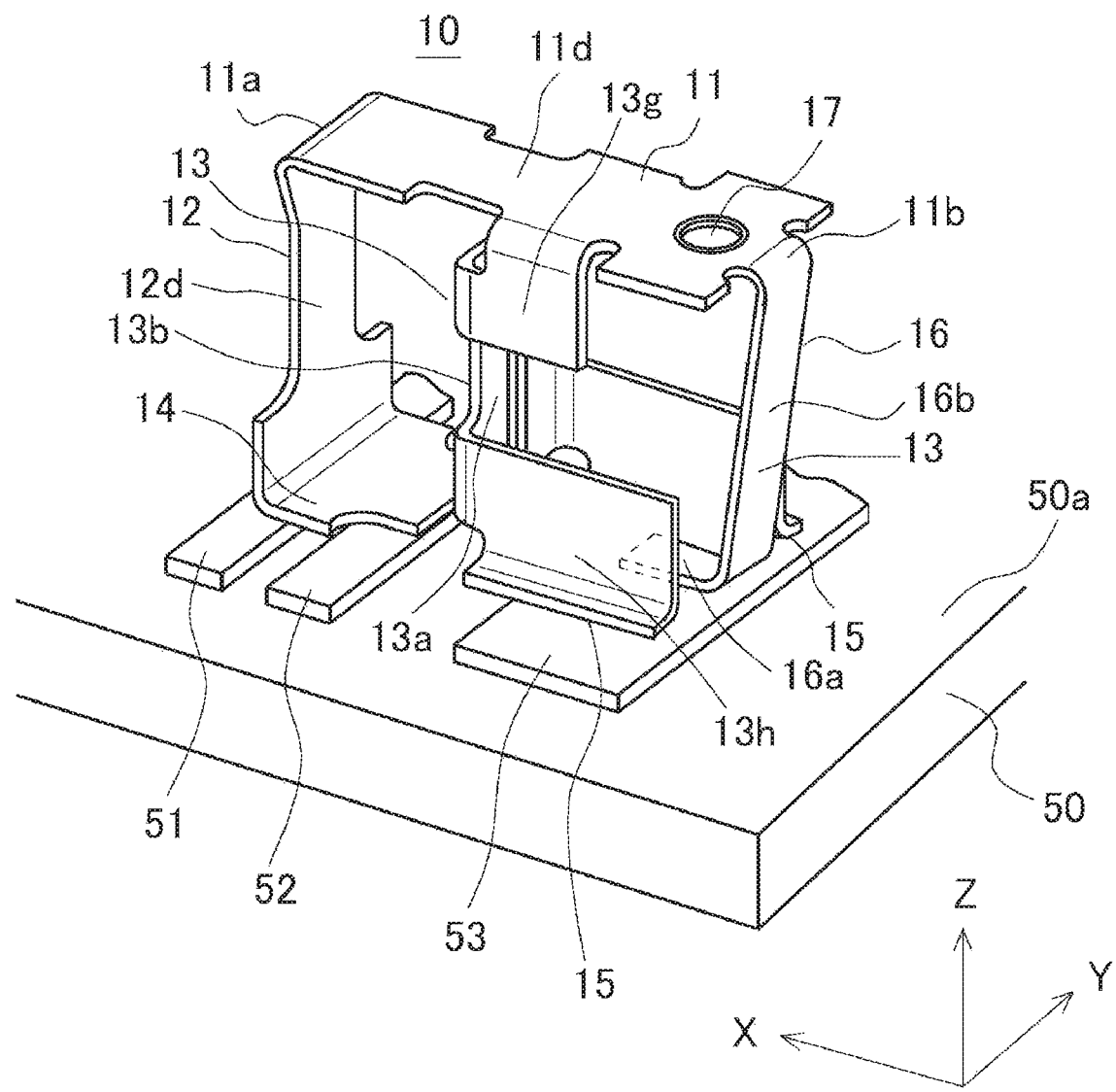
FIG. 1 is a perspective view showing the circuit protection element according to the first embodiment of the present invention in a state after mounted on a circuit board but before plastically deformed.

The circuit protection element according to the present invention is formed by bending a metal plate, in the same manner as the circuit protection element according to the second configuration example described in Patent Document 1, and this circuit protection element is used in a state accumulating elastic stress in the circuit protection element by being plastically deformed after being mounted on a circuit board with solder. First, the configuration of the circuit protection element 10 according to the first embodiment of the present invention will be described. FIG. 1 shows a state in which the circuit protection element 10 according to the first embodiment is mounted on a circuit board, but before plastically deformed.

As shown in FIG. 1, the circuit protection element 10, in the state after mounted on the circuit board 50 and before plastically deformed, comprises: the ceiling part 11 being substantially parallel to the mounting surface of the circuit board 50 and serving as a bending reference plane described later; the first leg part 12 formed by being bent from the first end part 11a in the longitudinal direction (X direction) of the ceiling part 11, so as to be substantially perpendicular to the mounting surface of the circuit board 50; the pair of the second leg parts 13 formed by being bent from both sides of the central part of the ceiling part 11, so as to be substantially symmetrical with respect to the center line (CC line in FIG. 4) of the width (Y direction) and substantially perpendicular to the mounting surface of the circuit board 50; the first mounting part 14 formed by bending the lower end part of the first leg part 12 inward in the longitudinal direction, so as to be substantially parallel to the mounting surface of the circuit board 50; the pair of the second mounting parts 15 formed by bending the lower end parts of the pair of the second leg parts 13 outward in the width direction, so as to be substantially parallel to the mounting surface of the circuit board 50; and the auxiliary leg part 16 formed by being bent from the second end part 11b of the ceiling part 11 in the longitudinal direction, toward the mounting surface of the circuit board 50. The first mounting part 14 is soldered to the first conductive pad 51 and second conductive pad 52, which are formed on the mounting surface of the circuit board 50, and the pair of the second mounting parts 15 are soldered to the third conductive pad 53 formed on the mounting surface. Further, elastic deformation parts 11d and 12d having a partially narrowed width are formed, respectively, in the vicinity of the central part of the ceiling part 11 along the longitudinal direction adjacent to the pair of second leg parts 13 and in the vicinity of the central part of the first leg part 12 along the height direction (Z direction).

Figure 4:
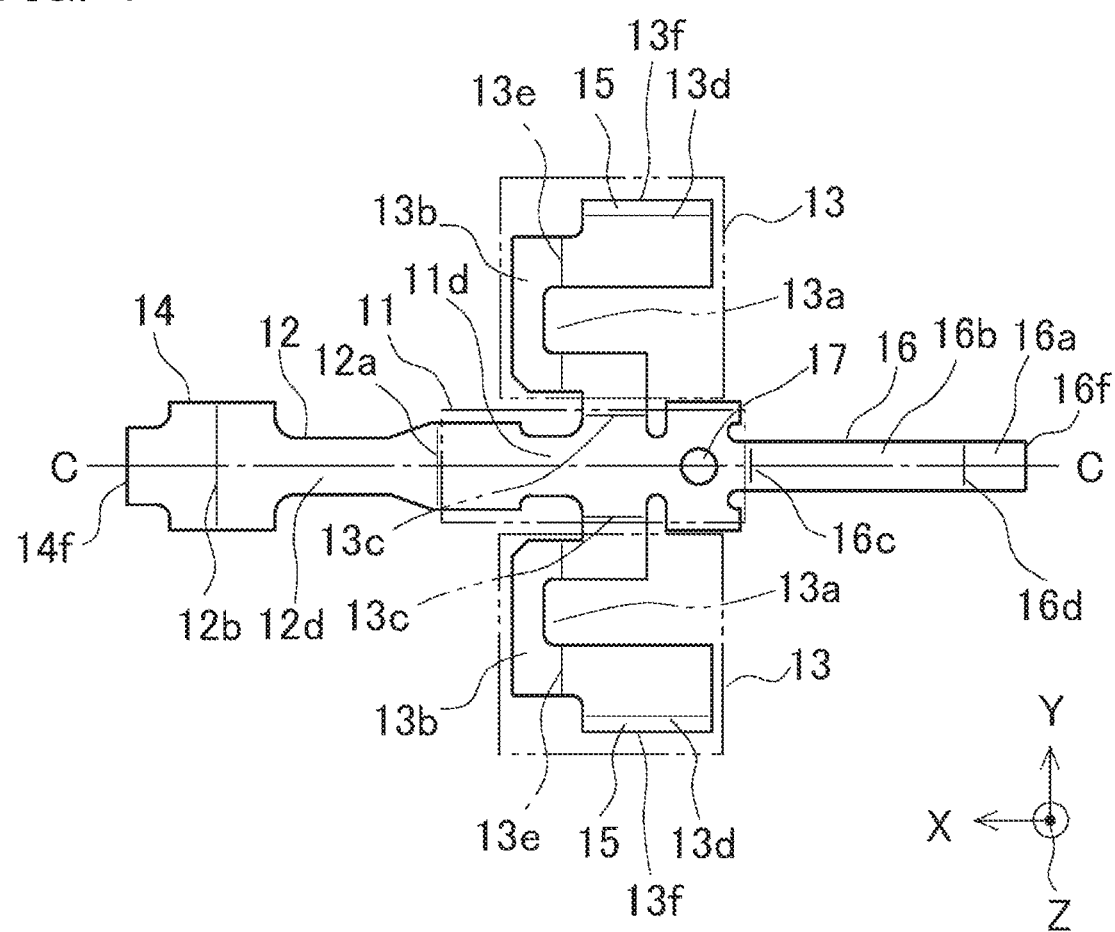
FIG. 4 is a developed view of the circuit protection element according to the first embodiment.

The pair of the second leg parts 13 has a substantially "J" or "U" shape in plan view in FIG. 4 due to the cutout 13a formed in the vicinity of the central part in the height direction, wherein the cutout is formed to facilitate plastic deformation and to set a plastic deformation part in a predetermined location, for example, in the central part. The curved part 13b composing a part of the substantially "J" or "U" shape is bent inward in the width direction so as to be substantially parallel to the first leg part 12. The rectangular parts 13g and 13h are of the second leg part 13 located at both sides of the cutout 13a (upper and lower positions in the height direction), and they are substantially perpendicular to the ceiling part 11 and also to the curved part 13b, and therefore the rigidity is high against the load applied in the height direction. On the other hand, in the curved part 13b, particularly, the central part bordered by the cutout 13a has low rigidity, so that the central part of the curved part 13b functions exclusively as the plastic deformation part described later. That is, the rectangular parts 13g and 13h function as a reinforcing part to raise the rigidity of a part other than the predetermined part of the second leg part 13, in order to easily plastically deform the predetermined part of the second leg part 13 (the central part of the curved part 13b). As a result, the position of the plastically deformed part and the amount of deformation are stabilized; the variation in elastic stress accumulated in the circuit protection element 10 is reduced; and the performance of the circuit protection element 10 is stabilized. Further, the rectangular part 13h at the lower side in the height direction is adjacent to and substantially perpendicular to the second mounting part 15, and connected to another part (a part of the curved part 13b located below the cutout part 13a) substantially perpendicular to both of the second mounting part 15 and the rectangular part 13h. Thereby, the rectangular part 13h also functions as a reinforcing part for maintaining parallelism of the pair of the second mounting parts 15 with respect to the ceiling part 11 (or the mounting surface of the circuit board 50) and mutual flushness of the pair of the second mounting parts 15. On the free end side of the auxiliary leg part 16, the contact part 16a is formed by being bent substantially parallel to the mounting surface of the circuit board 50 so as to be in contact with the mounting surface of the circuit board 50 or to be soldered to the conductive pad 53 when the second mounting parts 15 are soldered to the conductive pad 53 on the mounting surface of the circuit board 50. Further, in the vicinity of the second end part 11b of the ceiling part 11, the engagement hole 17 is formed, which is engaged with a tool for plastically deforming the circuit protection element 10 after the circuit protection element 10 is mounted on the circuit board 50.

Figure 5A:
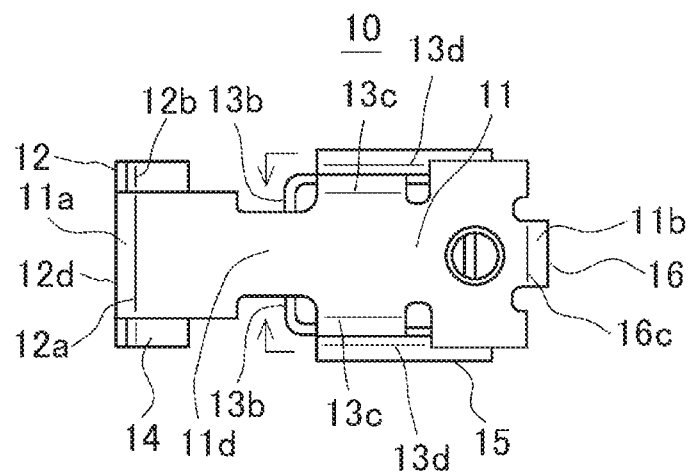
FIGS. 5A to 5C are views showing the circuit protection element according to the first embodiment after being bent.
Figure 5B:
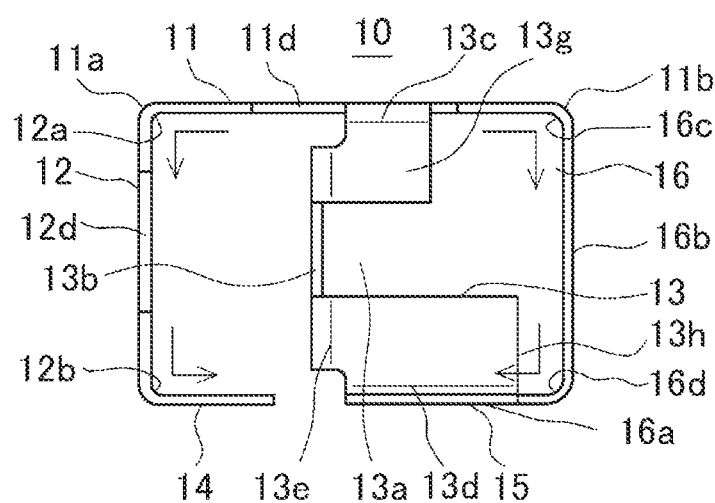
Figure 5C:
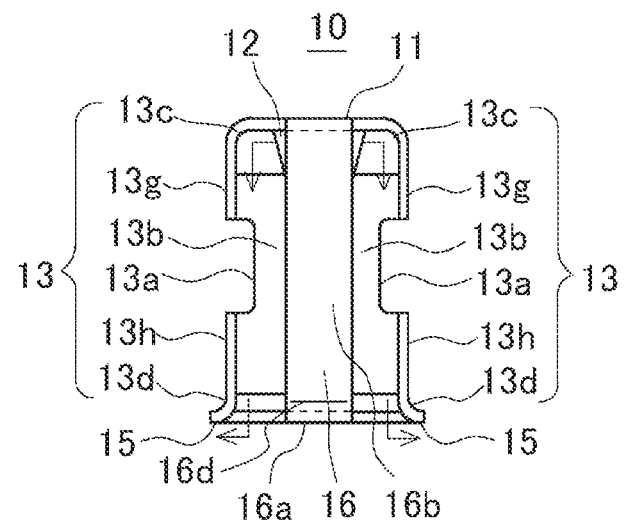

Next, the manufacturing process of the circuit protection element 10 according to the first embodiment will be described with reference to FIGS. 4 to 5C. FIG. 4 shows a state in which the circuit protection element 10 is punched out from a metal plate. The first leg part 12, the pair of the second leg parts 13 and the auxiliary leg parts 16 are each bent upward in a direction perpendicular to the paper surface. Further, in FIGS. 5A to 5C, the arrows indicate the bending direction. First, the pair of the second leg parts 13 are formed by making valley-folds, so that they become perpendicular to the ceiling part 11 serving as the bending reference plane (shown by the box of dot chain line in FIG. 4), using the imaginary lines 13c as folding lines corresponding to both side edges in the width of the ceiling part 11. Next, in order to form the pair of the second mounting parts 15, mountain-folds are made outward in the width direction, so that the pair becomes parallel to the ceiling part 11, using the imaginary lines 13d as folding lines parallel to the longitudinal direction, each of the imaginary lines 13d is located inside by a predetermined dimension from the free end 13f on the outer side in the width direction of the second leg part 13. As a result, the pair of the second mounting parts 15 is formed by being bent twice with respect to the ceiling part 11 as the bending reference plane. The curved parts 13b having the substantially "J" or "U" shape of the pair of the second leg parts 13 are bent inward in the width direction using the imaginary lines 13e as folding lines straddling each of the cutouts 13a. At this stage, the imaginary lines 13e are perpendicular to the ceiling part 11 and not using the ceiling part 11 as a bending reference plane, and the bending accuracy of the curved parts 13b affect only the parallelism of the pair of the second mounting parts 15, but do not affect the flatness (coplanarity) with the first mounting part 14.

Next, the first leg part 12 is formed by making a valley-fold using the imaginary line 12a as a folding line corresponding to the first end part 11a of the ceiling part 11, so that the first leg part 12 becomes perpendicular to the ceiling part 11. Next, in order to form the first mounting part 14, a valley-fold inward in the longitudinal direction is made using the imaginary line 12b as a folding line parallel to the width direction and located inside by a predetermined dimension from the free end 14f on the outer side in the longitudinal direction of the first mounting part 14, so that the first mounting part 14 becomes parallel to the ceiling part 11. As a result, the first mounting part 14 is formed by being bent twice with respect to the ceiling part 11 as the bending reference plane. In order to form the auxiliary leg part 16, a valley-fold is made to fold the auxiliary leg part 16 at about 90 degrees using the imaginary line 16c as a folding line corresponding to the second end part 11b in the longitudinal direction of the ceiling part 11 and parallel to the width direction, and further a valley-fold is made to form the contact part 16a substantially parallel to the mounting surface of the circuit board 50, using the imaginary line 16d as a folding line parallel to the width direction and located inside by a predetermined dimension from the free end 16f of the auxiliary leg part 16. Thereby, the circuit protection element 10 according to the first embodiment shown in FIGS. 1 to 5C is manufactured. Since the contact part 16a is also formed by being bent twice with respect to the bending reference plane, the flushness or coplanarity between the first mounting part 14 and the pair of the second mounting parts 15 does not deteriorate and reflow soldering can be performed smoothly without problem. In addition, since the first mounting part 14 and the contact part 16a of the auxiliary leg part 16 are bent inward in the longitudinal direction and the curved parts 13b of the pair of the second leg parts 13 are bent also inward in the width direction, it is possible to reduce the area occupied by the circuit protect element 10 mounted on the circuit board 50.

Figure 2:
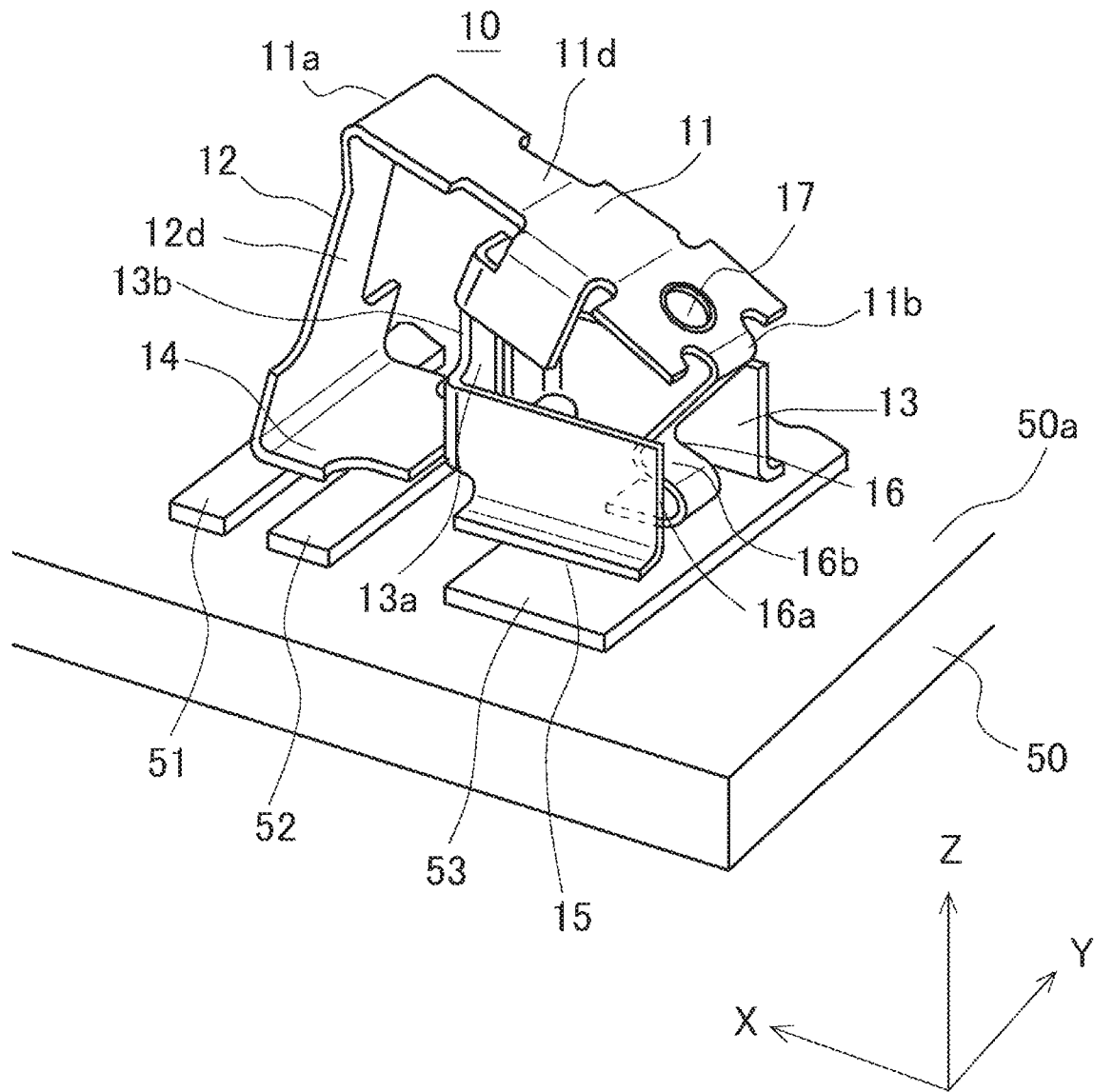
FIG. 2 is a perspective view showing the circuit protection element according to the first embodiment in a state after plastically deformed.

FIG. 2 shows a state in which the circuit protection element 10 is mounted on the circuit board 50 by soldering and then further plastically deformed. In the state shown in FIG. 1, a tool having a hemispherical tip is engaged with the engagement hole 17, a load is applied to the second end part 11b side of the ceiling part 11 and is strongly pressed against the circuit board 50 side. Then, the intermediate part 16b of the auxiliary leg part 16 is crushed and the curved parts 13b of the pair of the second leg parts 13 are bent into a substantially "<" shape, and the circuit protection element 10 is deformed in a state as shown in FIG. 2. The intermediate part 16b of the auxiliary leg part 16 and the curved part 13b of the pair of the second leg parts 13 function as plastic deformation parts of the circuit protection element 10, and continue to maintain the deformed shape even after the pressing force by the tool is released. At this time, as described above, since each of the ceiling part 11 and the first leg part 12 comprises, respectively, the elastic deformation parts 11d and 12d of narrow width, the ceiling part 11 and the first leg part 12 are also deformed. The force applied to those parts is smaller than the force applied to the intermediate part 16b of the auxiliary leg part 16 and the curved parts 13b of the second leg parts 13, and therefore plastic deformation does not occur and stress due to elastic deformation accumulates in those elastically deformable parts 11d and 12d. The state shown in FIG. 2 is the normal use state of the circuit protection element 10.

Figure 3:
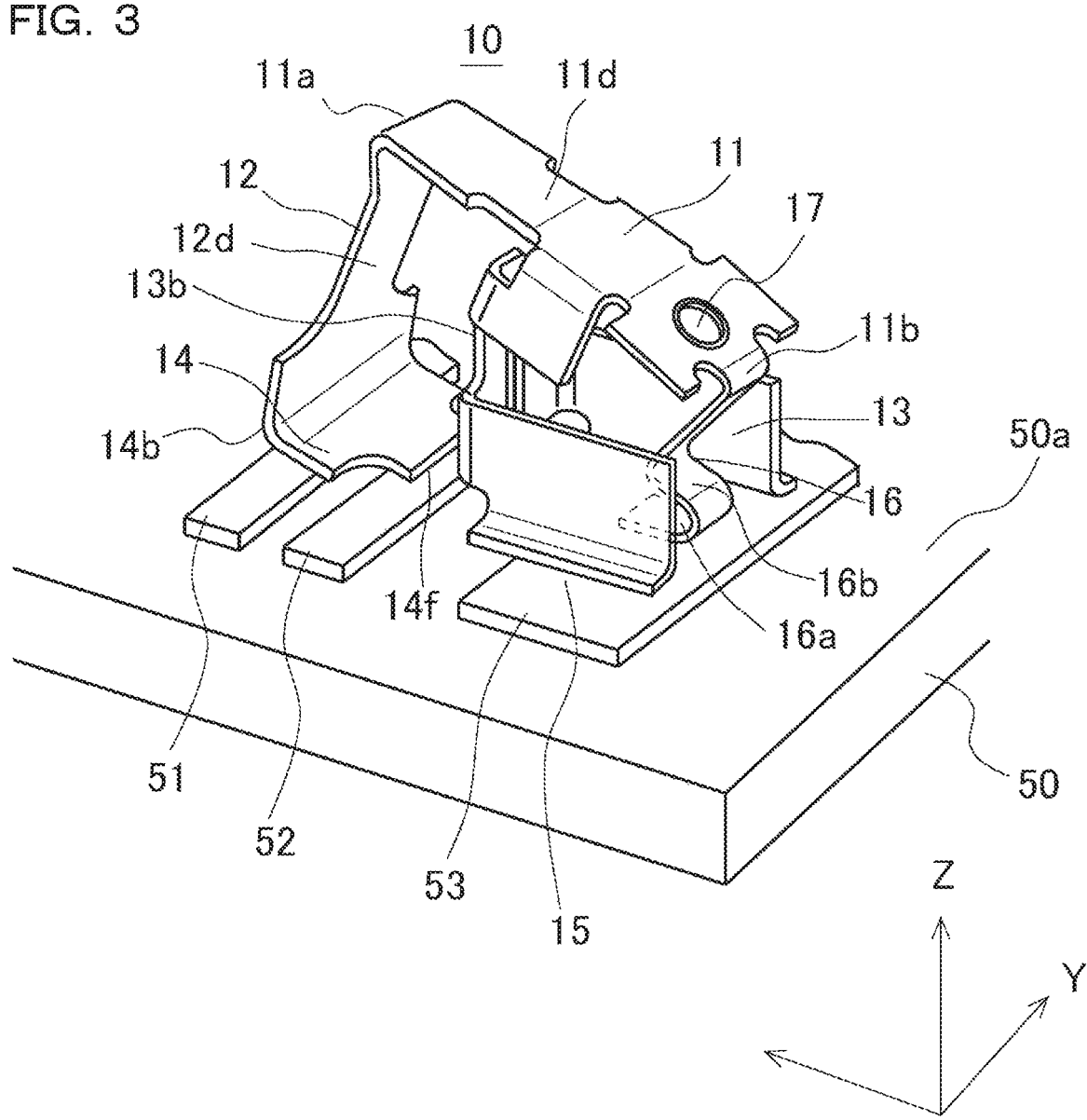
FIG. 3 is a perspective view showing the circuit protection element according to the first embodiment separating from the circuit board after the temperature near the mounting surface of the circuit board rises and the solder melts.

FIG. 3 shows a state in which the temperature near the mounting surface of the circuit board 50 rises, the solder melts, and the circuit protection element 10 separates from the circuit board 50. For example, if an electronic component (not shown) such as an IC mounted on the circuit board abnormally generates heat due to a failure or the like, and the temperature near the surface of the circuit board reaches a temperature equal to or higher than the melting temperature of the solder, the solder, which fixes the first mounting part 14 and the second mounting parts 15, respectively, to the first conductive pad 51 and second conductive pad 52 and to the third conductive pad 53, is softened or melted, and then the fixing of the first mounting part 14 and the second mounting part 15 by the soldering is released. In particular, when the solder fixing the first mounting part 14 to the first conductive pad 51 and second conductive pad 52 is melted, the stress accumulated in the vicinity of the first end part 11a of the ceiling part 11 and in the first leg part 12 is released, and those elastically deformed parts move to return to their original shapes. Originally, the first mounting part 14 is substantially parallel to the ceiling part 11, but the ceiling part 11 is inclined with respect to the mounting surface of the circuit board 50 due to the plastic deformation of the intermediate part 16b of the auxiliary leg part 16 and the curved parts 13b of the second leg parts 13, and therefore the first mounting part 14 moves to be inclined with respect to the mounting surface of the circuit board 50 and is flipped up in the direction away from the mounting surface of the circuit board 50, in a manner that the first leg part 12 rotates around the free end 14f of the first mounting part 14 as the fulcrum. When the first mounting part 14 is completely separated from the first conductive pad 51, the electric circuit is interrupted between the first conductive pad 51 and the second conductive pad 52, and the power supply to electronic components is stopped. Although the solder fixing the second mounting part 15 and the third conductive pad 53 is also melted or softened at the same time, and although the stress due to elastic deformation is also accumulated near the intermediate part 16b of the auxiliary leg part 16 and the curved parts 13b of the second leg parts 13 that are plastically deformed, such stress is smaller than the stress accumulated in the elastic deformation part 11d of the ceiling part 11 and the elastic deformation part 12d of the first leg part 12, so that the first mounting part 14 separates from the first conductive pad 51 and the second conductive pad 52 before the second mounting part 15 separates from the third conductive pad 53.

Figure 6A:
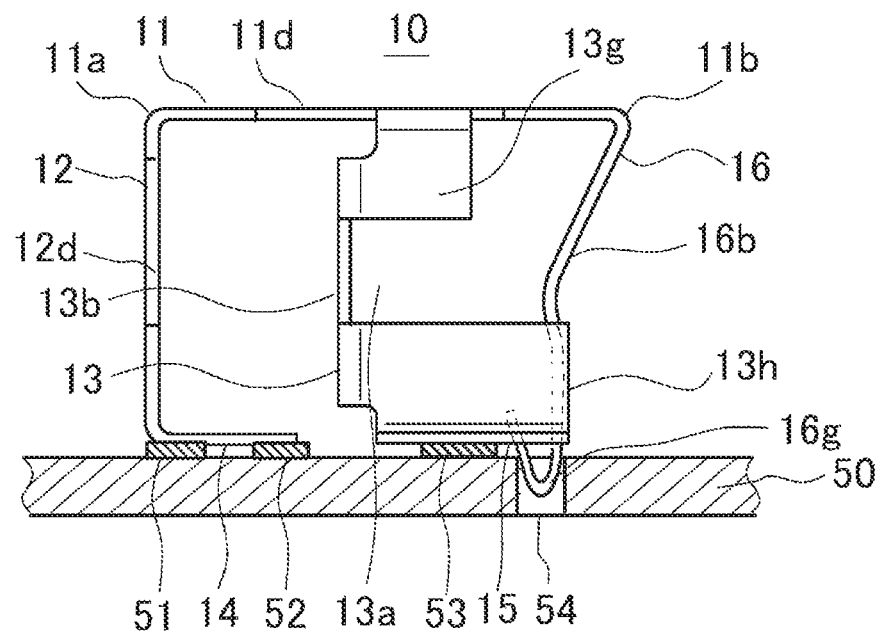
FIGS. 6A and 6B are views showing a first modification of the circuit protection element according to the first embodiment.
Figure 6B:
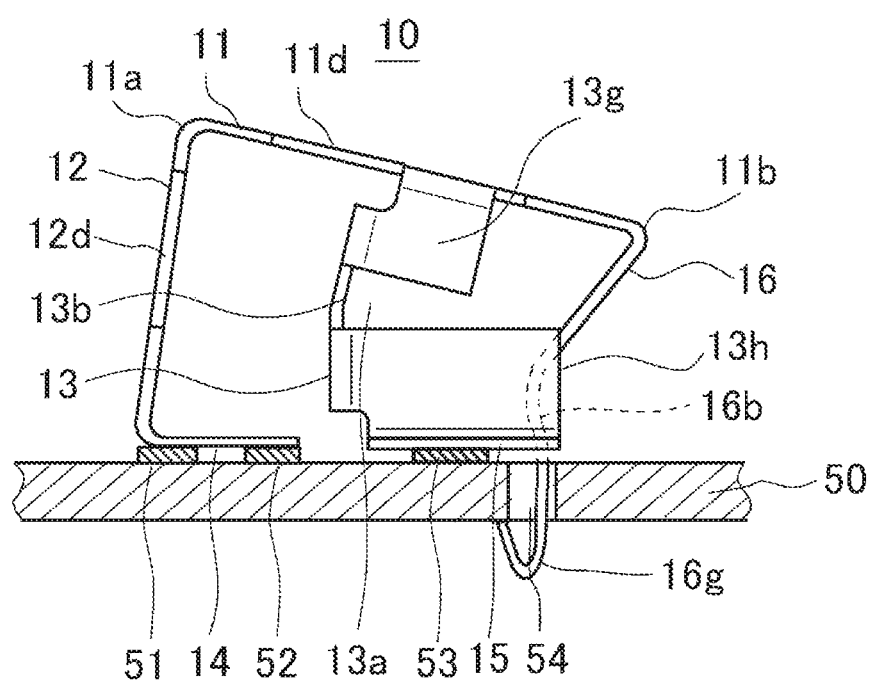

Next, a first modification of the circuit protection element 10 according to the first embodiment will be shown. FIG. 6A shows a modification of the circuit protection element 10, after mounted on the circuit board 50 but before plastically deformed, and FIG. 6B shows a state after plastically deformed. In the circuit protection element 10 according to the first modification, the hook part 16g is formed instead of the contact part 16a at the end of the auxiliary leg part 16 near to the circuit board 50 side, and also the locking hole 54 is formed in the circuit board 50 at the position facing the hook part 16g. When the second end part 11b side of the ceiling part 11 in the state shown in FIG. 6A is strongly pressed against the circuit board 50 side with the tool, the hook part 16g at the lower end of the auxiliary leg part 16 is elastically deformed and goes through the locking hole 54 of the circuit board 50, and protrudes to the opposite side of the mounting surface of the circuit board 50. When the pressing force by the tool is released, the elastic force of the auxiliary leg part 16 tries to restore the original shape slightly, but at this time, the tip of the hook part 16g comes into contact and locked with the surface opposite to the mounting surface of the circuit board 50. Therefore, even if the temperature near the mounting surface of the circuit board 50 rises and the solder melts, the second mounting part 15 does not separate from the conductive pad 53.

Figure 7A:
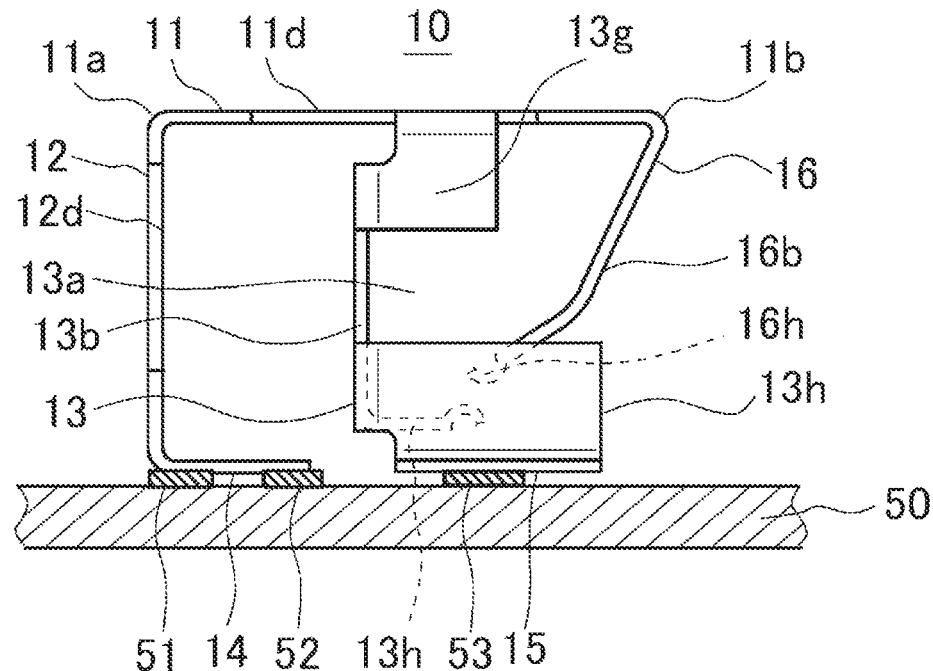
FIGS. 7A and 7B are views showing a second modification of the circuit protection element according to the first embodiment.
Figure 7B:
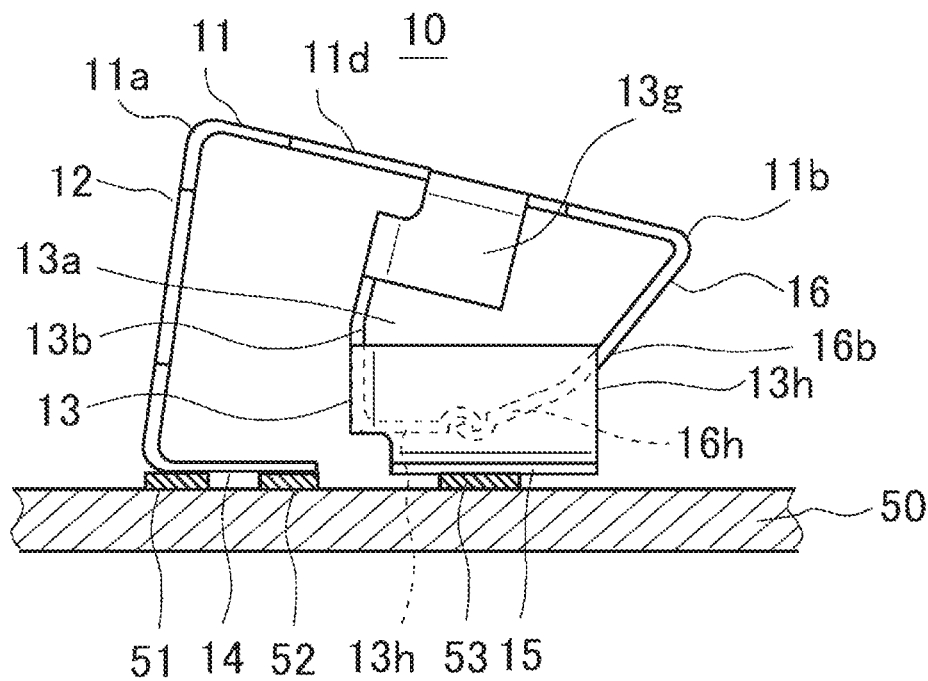

Next, a second modification of the circuit protection element 10 according to the first embodiment will be shown. FIG. 7A shows a modification of the circuit protection element 10, after mounted on the circuit board 50 and before being plastically deformed, and FIG. 7B shows a state after plastically deformed. In the circuit protection element 10 according to the second modification, the self-locking part 16h is formed instead of the contact part 16a at the end of the auxiliary leg part 16 on the circuit board 50 side, and also the lock part 13h is formed with a part of the curved part 13b of the second leg part 13, wherein the part of the curved part 13b is at the side facing the mounting surface of the circuit board 50 and it is bent substantially parallel to the mounting surface of the circuit board 50. The self-locking part 16h and the lock part 13h each have, for example, a half cylindrical shape so as to be smoothly locked as shown in the drawings, and the inside of the cylinder functions as an engaging recess. When the second end part 11b side of the ceiling part 11 is strongly pressed to the circuit board 50 side with the tool, the self-locking part 16h of the auxiliary leg part 16 moves under the lock part 13h of the second leg part 13, and reaches the position between the mounting surface of the circuit board 50 and the lock part 13h. When the pressing force by the tool is released, the auxiliary leg part 16 tries to return to the original shape slightly due to the elastic force thereof, however, at that time, the tip of the self-locking part 16h is locked by the lock part 13h, and the auxiliary leg part 16 is maintained in the deformed condition. In this case, it is not always necessary to plastically deform the intermediate part 16b of the auxiliary leg part 16, and the state, in which the ceiling part 11 and the first leg part 12 are elastically deformed, can be maintained by the self-locking function of the auxiliary leg part 16.

Figure 8:
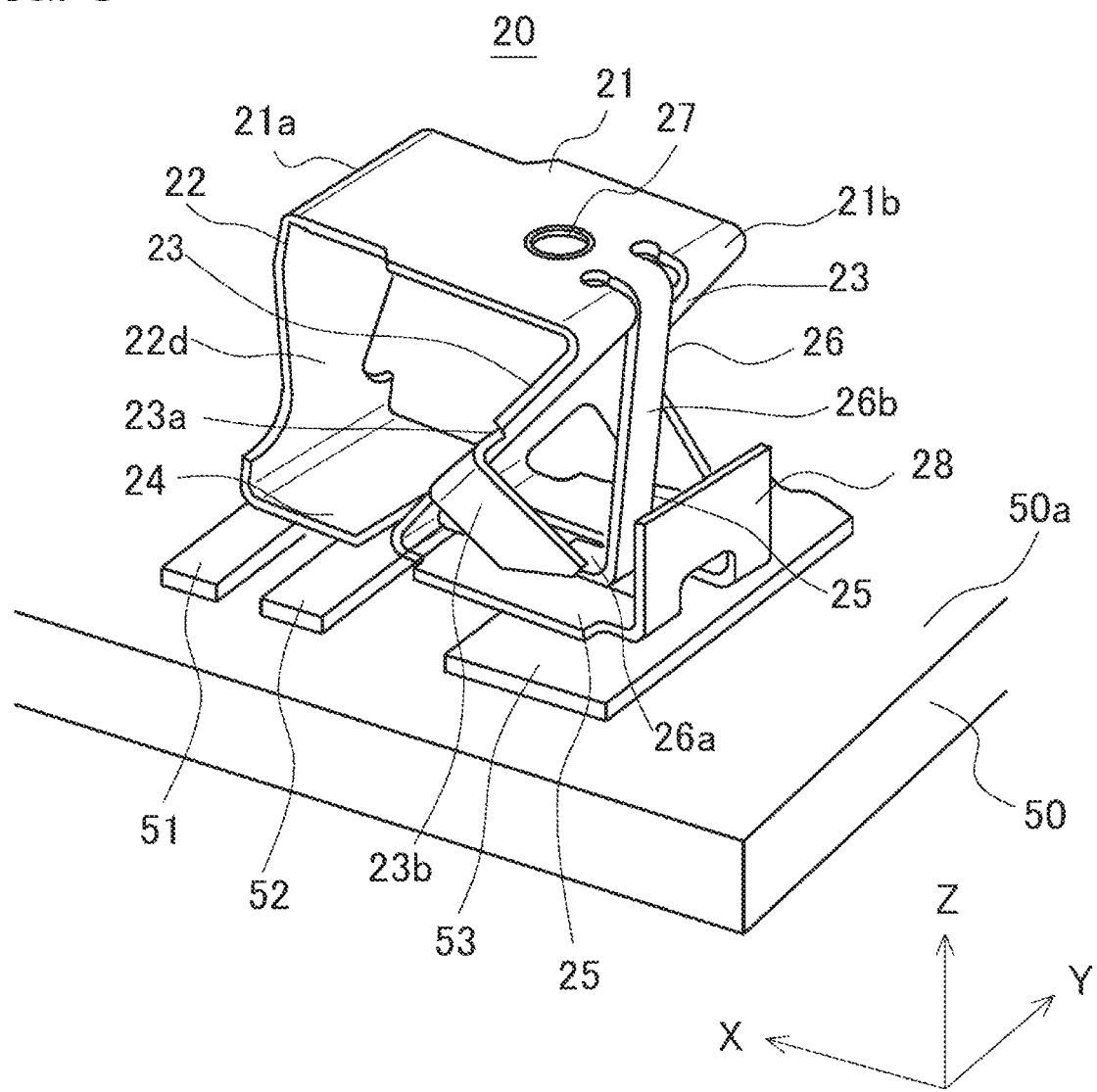
FIG. 8 is a perspective view showing the circuit protection element according to the second embodiment of the present invention in a state mounted on a circuit board but before plastically deformed.

Next, the configuration of the circuit protection element 20 according to the second embodiment of the present invention will be described. FIG. 8 shows a state in which the circuit protection element 20 according to the second embodiment is mounted on the circuit board 50, but before plastically deformed. As shown in FIG. 8, the circuit protection element 20, in the state after mounted on the circuit board 50 and before plastically deformed, comprises: the ceiling part 21 being substantially parallel to the mounting surface of the circuit board 50 and serving as a bending reference plane; the first leg part 22 formed by being bent from the first end part 21a in the longitudinal direction (X direction) of the ceiling part 21, so as to form a predetermined angle close to a vertical angle with respect to the mounting surface of the circuit board 50; the pair of the second leg parts 23 formed by being bent from the second end part 21b in the longitudinal direction of the ceiling part 21, so as to be substantially symmetrical with respect to the center line (DD line in FIG. 10) of the width (Y direction) and to form a predetermined angle smaller than the angle formed by the first leg part 22 with respect to the mounting surface of the circuit board 50; the first mounting part 24 formed by bending the lower end part of the first leg part 22 inward in the longitudinal direction, so as to be substantially parallel to the mounting surface of the circuit board 50; the pair of the second mounting parts 25 formed by bending the lower end parts of the pair of the second leg parts 23 outward in the longitudinal direction, so as to be substantially parallel to the mounting surface of the circuit board 50; and the auxiliary leg part 26 formed by being bent from the second end part 21b of the ceiling part 21 in the longitudinal direction, toward the mounting surface of the circuit board 50. Further, the distal ends of the pair of the second mounting parts 25 in the longitudinal direction are bent so as to be substantially perpendicular to the mounting surface of the circuit board 50, and the bent ends are connected together in the width direction to form the connecting part 28. That is, the connecting part 28 is adjacent to the second mounting parts 25 and perpendicular to the second mounting parts 25, and connects the pair of the second mounting parts 25 being parallel to each other. As a result, the connecting part 28 functions as a reinforcing part for maintaining parallelism and flatness of the pair of the second mounting parts 25 with respect to the ceiling part 21 (or the mounting surface of the circuit board 50) and parallelism and flatness between the pair of the second mounting parts 25. The first mounting part 24 is soldered to the first conductive pad 51 and second conductive pad 52 formed on the mounting surface of the circuit board 50, and the pair of the second mounting parts 25 is soldered to the third conductive pad 53, as in the case of the first embodiment. The elastic deformation part 22d is formed in the vicinity of the central part in the height direction (Z direction) of the first leg part 22, which is formed to facilitate elastic deformation.

The pair of the second leg parts 23 has the cutout 23a formed in the vicinity of the central part in the longitudinal direction (X direction) in order to facilitate plastic deformation. The pair of stoppers 23b adjacent to the cutouts 23a are bent, outward in the longitudinal direction, so as to be substantially parallel to each other. By providing these cutouts 23a, when a load is applied to the vicinity of the second end part 21b of the ceiling part 21, the stress concentrates on the cutouts 23a, and the second leg part 23 is plastically deformed around the cutouts 23a. In the second embodiment, the central part of the second leg part 23 functions exclusively as a plastic deformation part described later. The contact part 26a is formed on the free end side of the auxiliary leg part 26, as in the case of the first embodiment. Further, the engaging hole 27 engaging with the tool is formed near the second end part 21b of the ceiling part 21.

Figure 10:
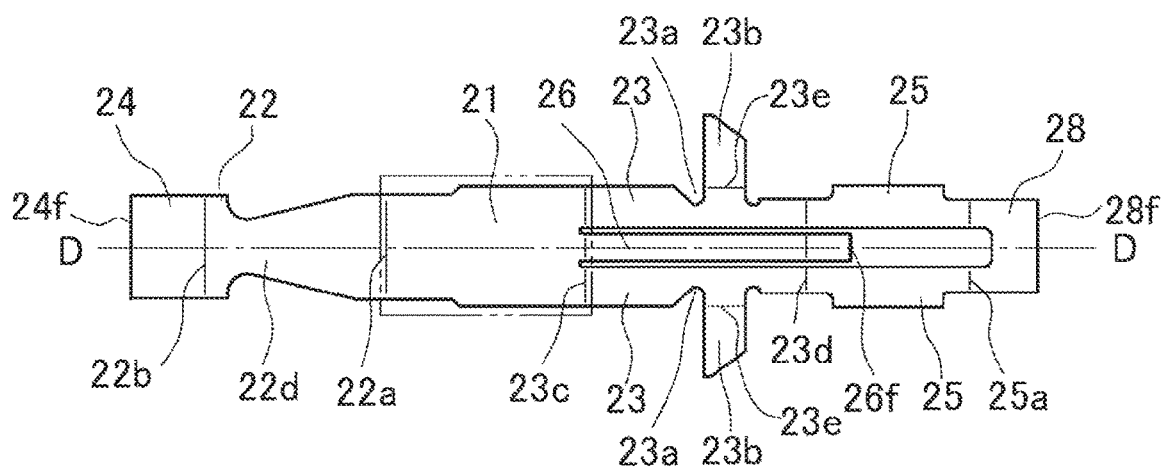
FIG. 10 is a developed view of the circuit protection element according to the second embodiment.
Figure 11A:
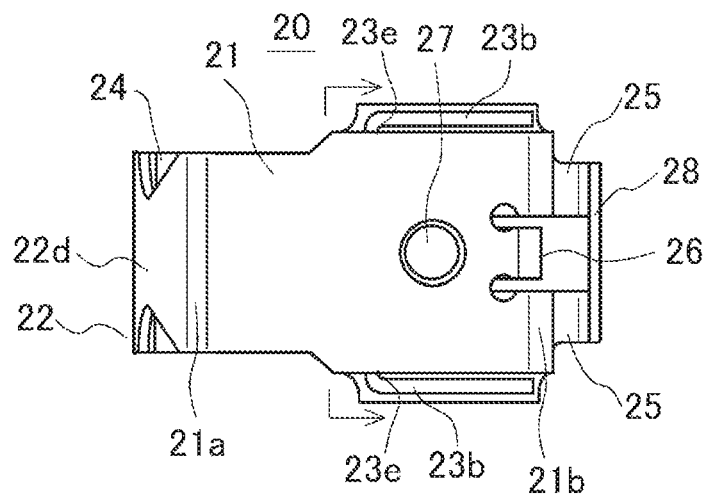
FIGS. 11A to 11C are views showing the circuit protection element according to the second embodiment after being bent.
Figure 11B:
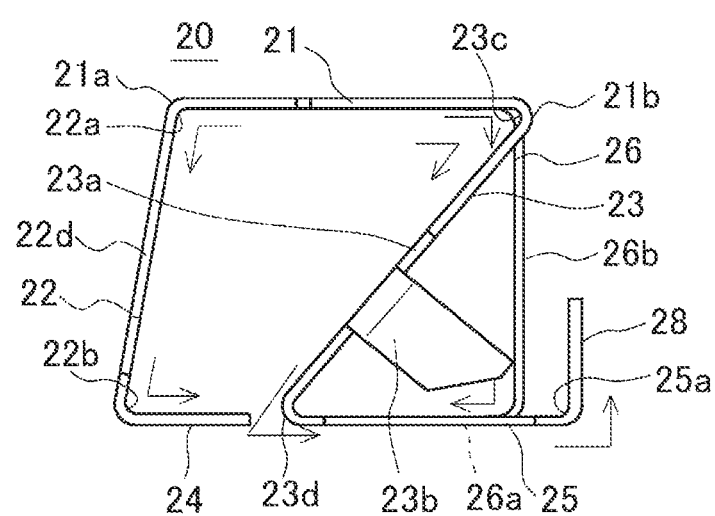
Figure 11C:
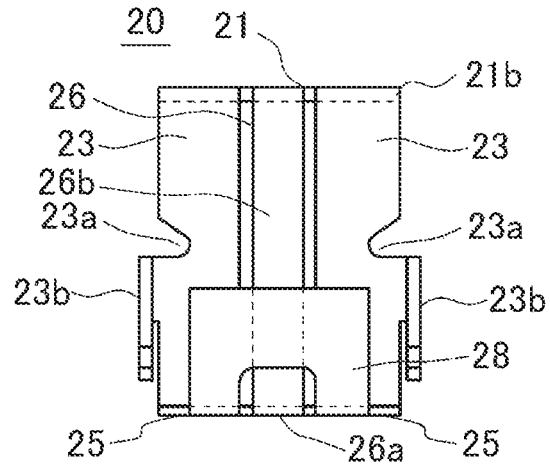

The manufacturing process of the circuit protection element 20 according to the second embodiment will be described with reference to FIGS. 10 to 11C. FIG. 10 shows a state in which the circuit protection element 20 is punched out from a metal plate. The first leg part 22, the pair of the second leg parts 23, and the auxiliary leg part 26 are each bent upward in a direction perpendicular to the paper surface. Further, in FIGS. 11A to 11C, the arrow indicates the bending direction. First, the stoppers 23b projecting outward in the width direction from the pair of the second leg parts 23 are bent by making valley-folds, using the imaginary lines 23e as folding lines parallel to the longitudinal direction of the ceiling part 21 serving as the bending reference plane (shown by the box of dot chain line in FIG. 10), so as to be perpendicular to the central part (plastic deformation part) of the second leg parts 23. The pair of the second legs 23 are bent inward in the longitudinal direction by making valley-folds, using the imaginary line 23c as a folding line corresponding to the second end part 21b of the ceiling part 21 in the longitudinal direction, so as to have a predetermined folding angle larger than 90 degrees with respect to the ceiling part 21 (for example, 135 degrees from the original position).

Note, since the pair of the second mounting parts 25 is connected by the connecting part 28, unlike the case of the first embodiment, the auxiliary leg part 26 can not be formed after forming the pair of the second mounting parts 25. Therefore, in order to form the auxiliary leg part 26, a valley-fold is made at about 90 degrees using the imaginary line 23c parallel to the width direction as a folding line corresponding to the second end part 21b of the ceiling part 21 in the longitudinal direction, and further to form the contact part 26a substantially parallel to the mounting surface of the circuit board 50, a valley-fold is made using the imaginary line 26e as a folding line parallel to the width direction and located inside by a predetermined dimension from the free end 26f of the auxiliary leg part 26.

In order to form the pair of the second mounting parts 25, mountain-folds are made outward in the longitudinal direction so that the pair becomes parallel to the ceiling part 21, using the imaginary line 23d as a folding line parallel to the width direction and located inside by a predetermined dimension from the free end 28f on the outer side in the longitudinal direction of the connecting part 28. As a result, the pair of the second mounting parts 25 is formed by being bent twice with respect to the ceiling part 21 as the bending reference plane. Thereafter, a mountain-fold is made in the height direction (Z direction) so that the connecting part 28 becomes perpendicular to the ceiling part 21, using the imaginary line 25a as a folding line parallel to the longitudinal direction and located inside by a predetermined dimension from the free end 28f on the outer side in the longitudinal direction of the connecting part 28. Note, since the pair of the second mounting parts 25 is connected by the connecting part 28, unlike the case of the first embodiment, the pair of the second leg parts 23 and the pair of the second mounting parts 25 are maintained to be flush each other.

Further, the first leg part 22 is formed by making a valley-fold using the imaginary line 22a as a folding line corresponding to the first end part 21a of the ceiling part 21, so that the first leg part 22 becomes perpendicular to the ceiling part 21 or at a predetermined angle around the right angle (for example 80 degrees) with respect to the ceiling part 21. In order to form the first mounting part 24, a valley-fold is made inward in the longitudinal direction using the imaginary line 22b as a folding line parallel to the width direction and located inside by a predetermined dimension from the free end 24f on the outer side in the longitudinal direction of the first mounting part 24, so that the first mounting part 24 becomes parallel to the ceiling part 21. Thereby, the first mounting part 24 is formed by being bent twice with respect to the ceiling part 21 as the bending reference plane. In addition, since the first mounting part 24 and the pair of the second leg parts 23 are bent inward in the longitudinal direction, and the connecting part 28 connecting the pair of the second mounting parts 25 is bent upward in the height direction, it is possible to reduce the area occupied by the circuit protection element 20 mounted on the circuit board 50.

Figure 9:
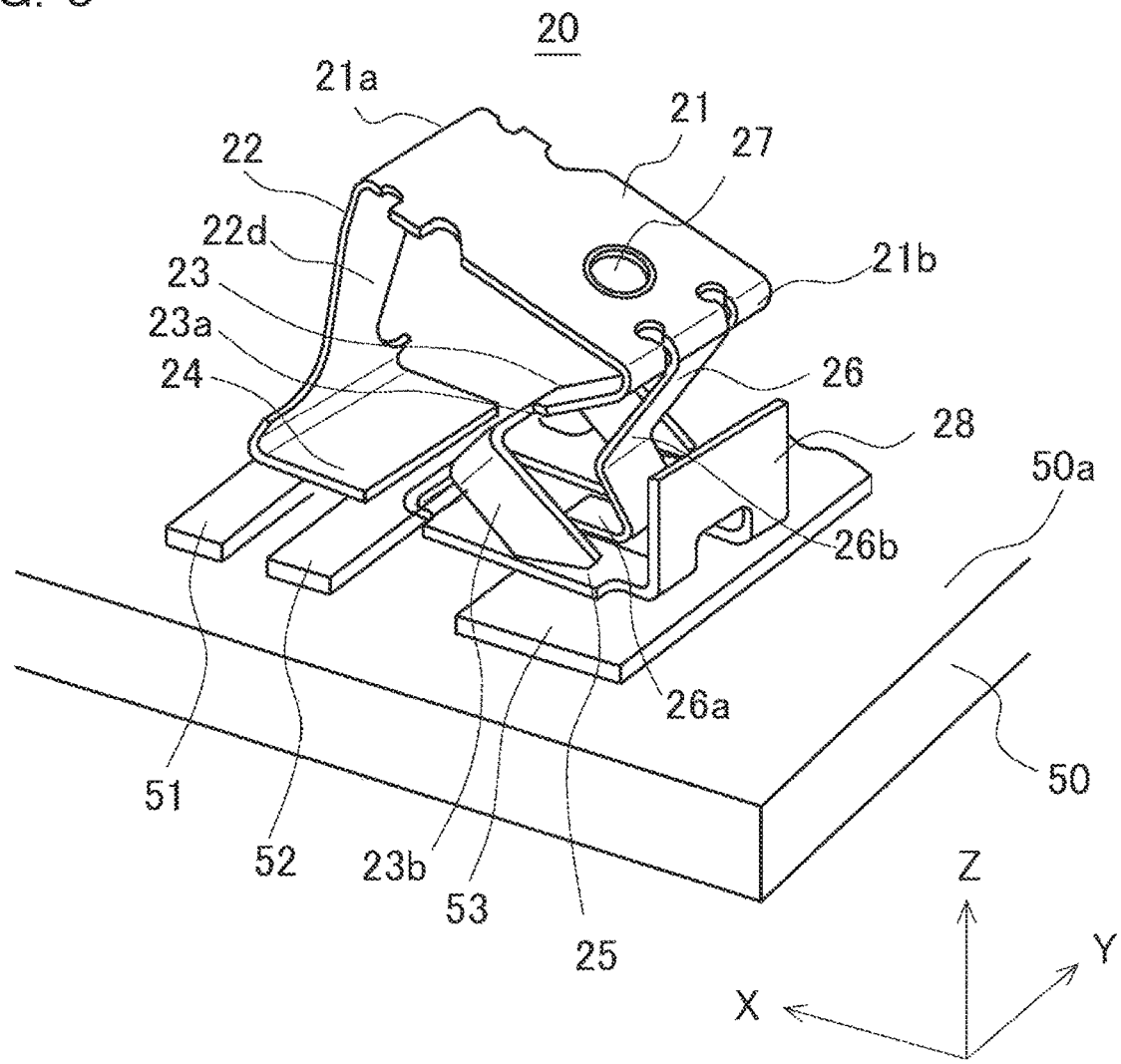
FIG. 9 is a perspective view showing the circuit protection element according to the second embodiment in a state after plastically deformed.

FIG. 9 shows a state in which the circuit protection element 20 has been plastically deformed after being mounted on the circuit board 50 by soldering. In the state shown in FIG. 8, the tool is engaged with the engagement hole 27, a load is applied to the second end part 21b side of the ceiling part 21 and is strongly pressed against the circuit board 50 side. Then, the intermediate part 26b of the auxiliary leg part 26 is crushed, and the vicinities of the central parts of the pair of the second leg parts 23 are each bent into a substantially "<" shape, and the circuit protection element 20 is deformed in a state as shown in FIG. 9. The intermediate part 26b of the auxiliary leg part 26 and the vicinities of the cutouts 23a in the central parts of the pair of the second leg parts 23 function as plastic deformation parts of the circuit protection element 20 and are maintained deformed even after the pressing force by the tool is released. At that time, the vicinity of the first end part 21a of the ceiling part 21 and also the first leg parts 22 are deformed too, and the stress due to elastic deformation is accumulated in those parts. The state shown in FIG. 9 is the normal use state of the circuit protection element 20. Further, when a load is applied to the second end part 21b side of the ceiling part 21 to plastically deform the intermediate part 26b of the auxiliary leg part 26 and the vicinity of the central part of the pair of the second leg parts 23, the stoppers 23b come into contact with members located on the circuit board 50 side such as the upper surfaces of the second mounting parts 25, and therefore, it is possible to prevent excessive deformation of the intermediate part 26b of the auxiliary leg part 26 and the vicinity of the central part of the pair of the second leg parts 23. Further, since the stoppers 23b are substantially perpendicular to a line to be used as a folding line when the vicinities of the central parts of the second leg parts 23 are plastically deformed, the rigidity of the parts where the stoppers 23 are formed in the second leg parts 23 become high, therefore, the positions of and deformation amount of the plastically deformed parts are stable, the variation is small for the elastic stress accumulated in the circuit protection element 20, and the performance of the circuit protection element 20 is stable. That is, each of the stoppers 23b functions as a reinforcing part for increasing the rigidity of the part of the second leg 23 other than a predetermined specific part and functions as a part for facilitating plastic deformation of the predetermined specific part (namely, the vicinity of the central part) of the second leg 23.

Figure 12A:
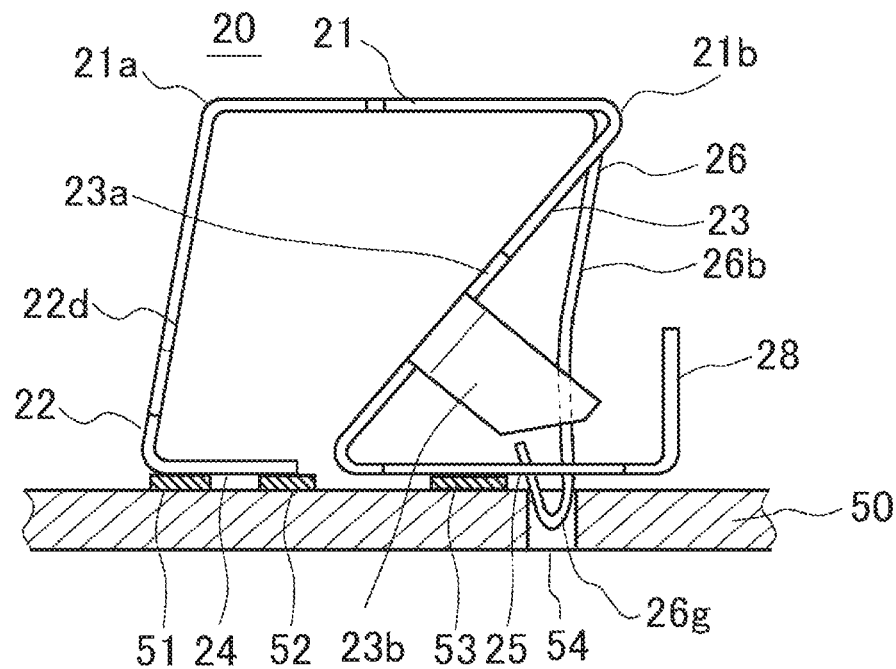
FIGS. 12A and 12B are views showing a first modification of the circuit protection element according to the second embodiment.
Figure 12B:
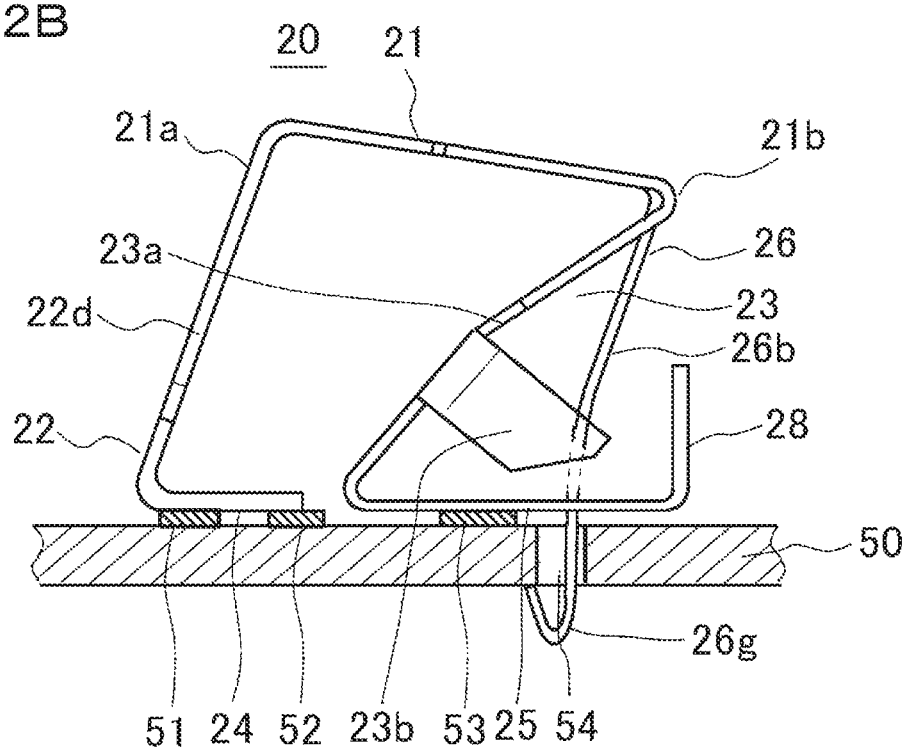

Next, a first modification of the circuit protection element 20 according to the second embodiment will be shown. FIG. 12A shows a state of the circuit protection element 20 mounted on the circuit board 50 before being plastically deformed, and FIG. 12B shows a state after plastically deformed. In the circuit protection element 20 according to the first modification, the hook part 26g is formed at the end of the auxiliary leg part 26 on the circuit board 50 side instead of the contact part 26a, and also the locking hole 54 is formed in the circuit board 50 at the position facing the hook part 26g. Similarly to the first modification of the first embodiment, when the second end part 21b side of the ceiling part 21 in the state shown in FIG. 12A is strongly pressed against the circuit board 50 side with the tool, the hook part 26g at the lower end of the auxiliary leg part 26 is elastically deformed and goes through the locking hole 54 of the circuit board 50, and protrudes to the opposite side of the mounting surface of the circuit board 50. When the pressing force by the tool is released, the elastic force of the auxiliary leg part 26 tries to restore the original shape slightly, but at this time, the tip of the hook part 26g comes into contact and locked with the surface opposite to the mounting surface of the circuit board 50. Therefore, even if the temperature near the mounting surface of the circuit board 50 rises and the solder melts, the second mounting part 25 does not separate from the conductive pad 53. In addition, the intermediate part 26b of the auxiliary leg part 26 may be curved, for example, in a substantially "<" shape so that the hook part 26g can be elastically deformed smoothly and go though the locking hole 54 of the circuit board 50.

Figure 13A:
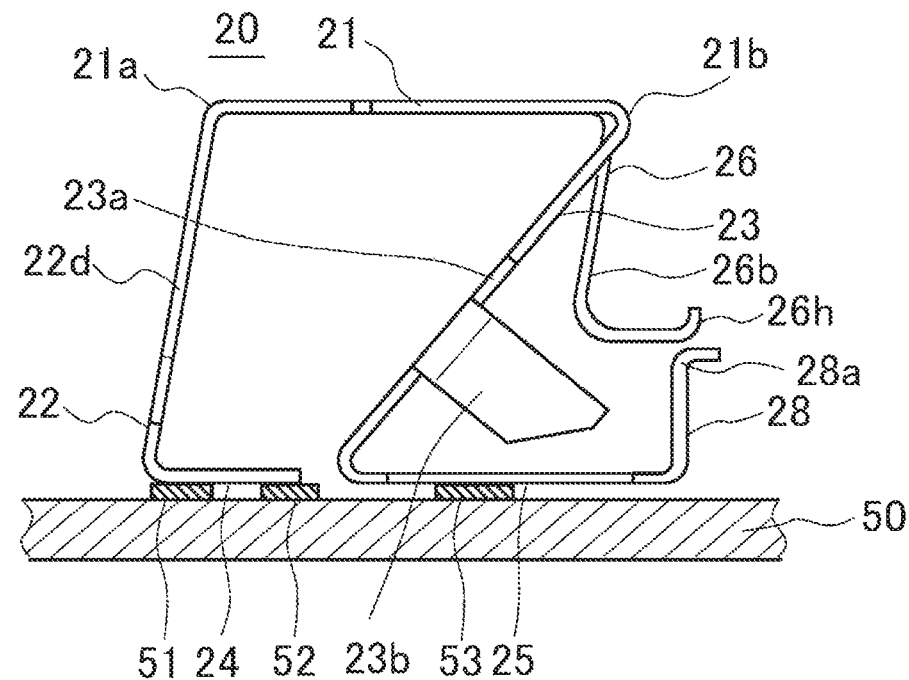
FIGS. 13A and 13B are views showing a second modification of the circuit protection element according to the second embodiment.
Figure 13B:
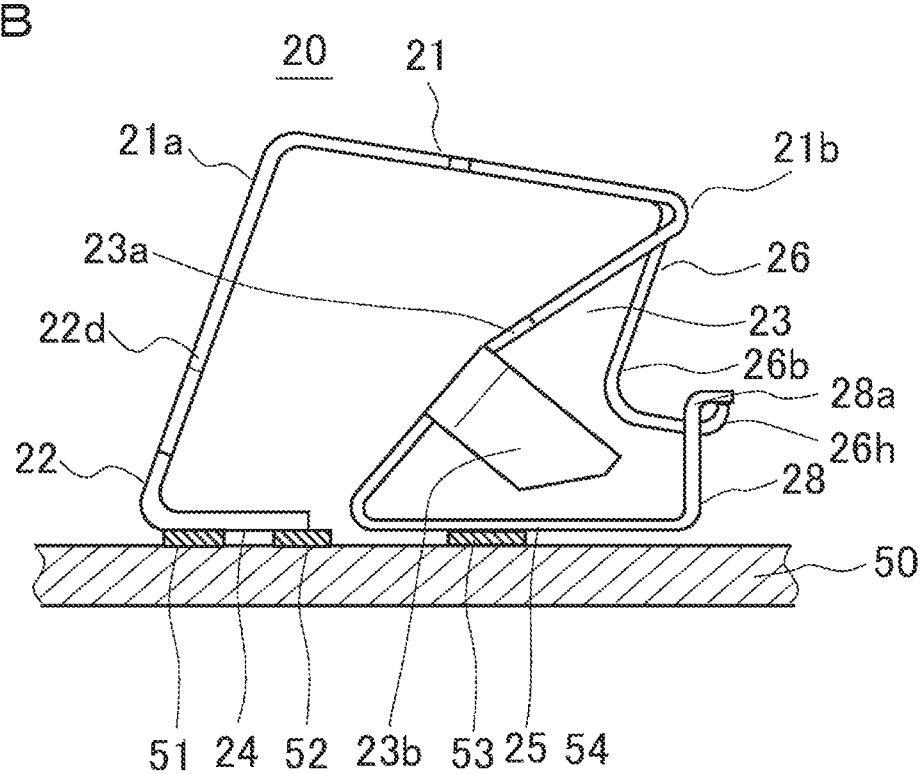
Figure 14A:
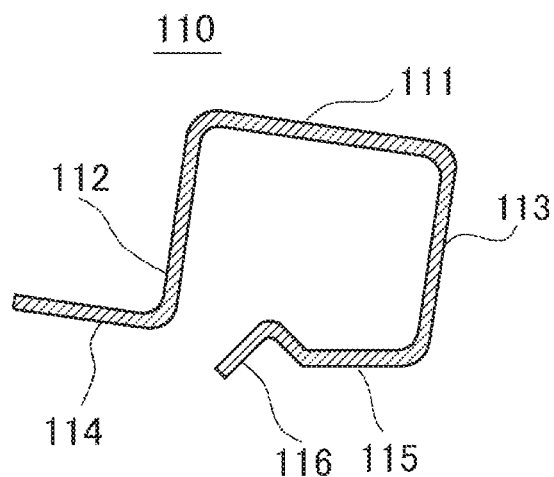
FIGS. 14A to 14C are side views showing a first configuration example of a conventional circuit protection element.
Figure 14B:
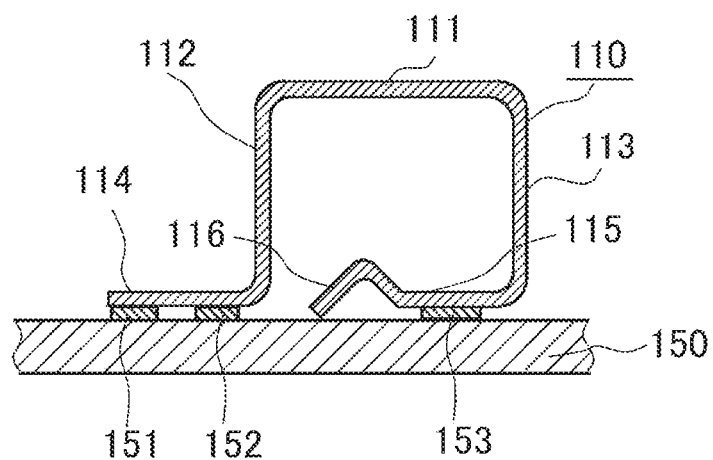
Figure 14C:
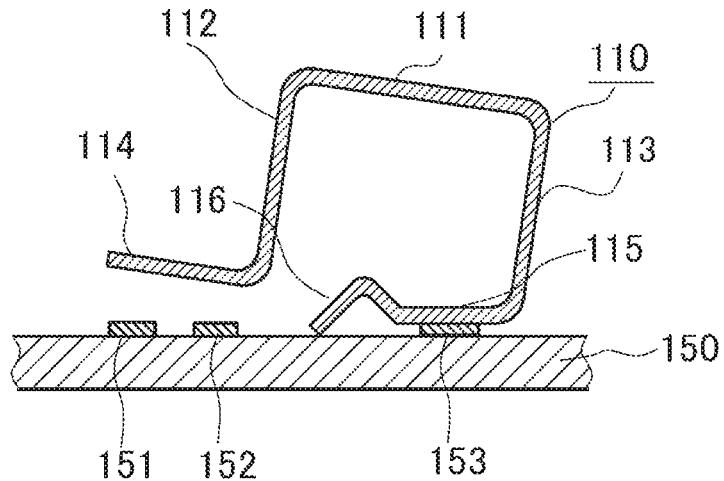
Figure 15A:
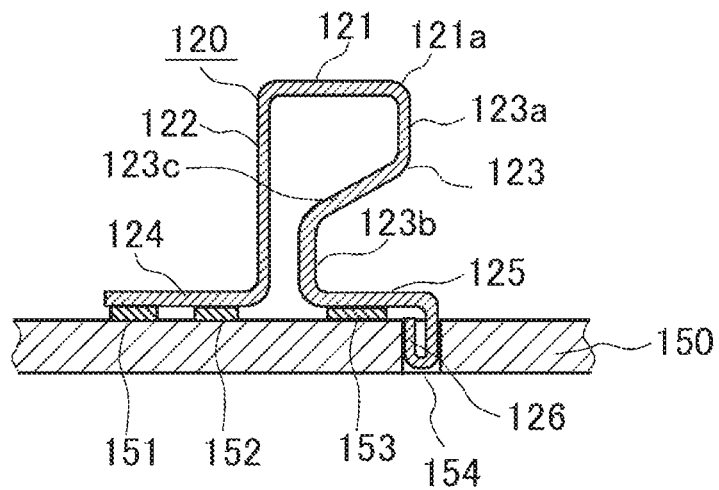
FIGS. 15A to 15C are side views showing a second configuration example of a conventional circuit protection element.
Figure 15B:
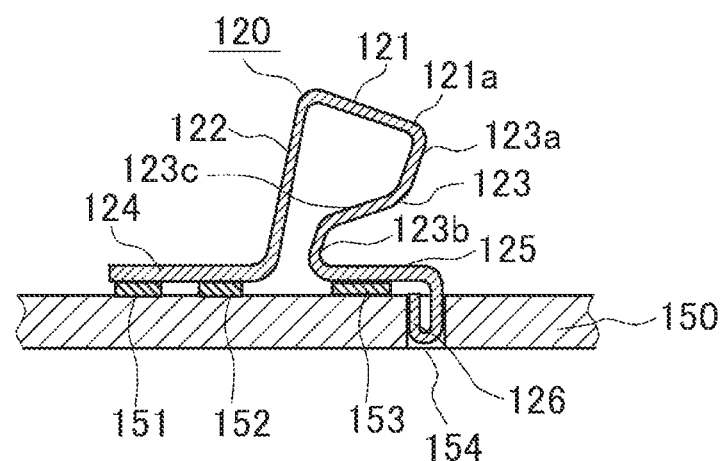
Figure 15C:
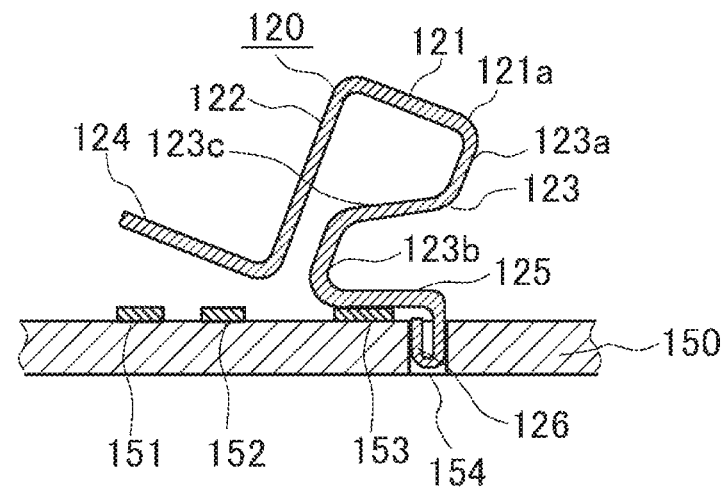

Next, a second modification of the circuit protection element 20 according to the second embodiment will be shown. FIG. 13A shows a state of the circuit protection element 20 mounted on the circuit board 50 before being plastically deformed, and FIG. 13B shows a state after plastically deformed. In the circuit protection element 20 according to the second modification, the self-lock part 26h is formed, instead of the contact part 26a, at the end part of the auxiliary leg part 26 bent substantially parallel to the mounting surface of the circuit board 50. The intermediate part 26b of the auxiliary leg part 26 is curved, for example, in a substantially "L" shape so that the self-locking part 26h can be elastically deformed smoothly and can go under the connecting part 28. Further, in order that the self-locking part 26h can be smoothly locked to the lower end of the connecting part 28, the upper end of the connecting part 28 is directed outward in the longitudinal direction and bent so that the outer peripheral surface thereof has the cylindrical shape 28a as shown in the figure. When the second end part 21b side of the ceiling part 21 is strongly pressed against the circuit board 50 side by the tool, the self-locking part 26h of the auxiliary leg part 26 elastically deforms and slides on the inside surface of the connecting part 28 so as to be fitted into the space formed between the pair of the second mounting parts 25. When the pressing force of the tool is released, the elastic force of the auxiliary leg part 26 tries to restore the original shape slightly, but at this time, the tip of the self-locking part 26h is locked to the lower end of the connecting part 28, and the auxiliary leg part 26 is maintained in a deformed state. In this case, it is not always necessary to plastically deform the intermediate part 26b of the auxiliary leg part 26, but nevertheless the ceiling part 21 and the first leg part 22 can be kept elastically deformed by the self-locking function of the auxiliary leg part 26.

In the case where a specific electronic component that may serve as a heat source on the circuit board 50 is known in advance and the circuit protection element 10 or 20 is mounted on such a circuit board, it is preferable that the circuit protection element 10 or 20 is arranged so that the first end part 11a or 21a side of the ceiling part 11 or 21, that is, the first mounting part 14 or 24 is arranged near such a specific electronic component. In that case, depending on the distance from the specific electronic component, a temperature difference occurs between the temperature of the solder fixing the first mounting part 14 or 24 to the first conductive pad 51 and the second conductive pad 52 and the temperature of the solder fixing the second mounting parts 15 or 25 to the third conductive pad 53, and then the solder at the side closer to the specific electronic component, that is, the solder fixing the first mounting part 14 or 24 to the first conductive pad 51 and the second conductive pad 52 is melted first. Therefore, for example, it is not necessary to form the hook part 16g or 26g at the tip of the auxiliary leg part 16 or 26 or to form the locking hole 54 in the circuit board 50 shown in FIGS. 6A, 6B or FIGS. 12A, 12B, and the manufacturing costs of the circuit protection element 10 or 20 and the circuit board 50 can be reduced and the yield thereof can be improved.

Further, in the above description, the electric circuit is cut off between the first conductive pad 51 and the second conductive pad 52, but the electric circuit may be configured so that the circuit is cut off between, one or both of the first conductive pad 51 and the second conductive pad 52, and the third conductive pad 53 (the first leg part 12 or 22, the ceiling part 11 or 21, and the second leg parts 13 or 23 are energized in the same manner as the normal operation). In the above description, the second mounting parts 15 or 25 are mounted on the third conductive pad 53 by soldering, but, in the case, the electric circuit is cut off between the first conductive pad 51 and the second conductive pad 52, it is not necessary to solder the second mounting parts 15 or 25 to the third conductive pad 53, and it is enough only to place the second mounting parts 15 or 25 on the third conductive pad 53. Further, even when the electric circuit is cut off between the first conductive pad 51 and the second conductive pad 52, the first mounting part 14 or 24 may be soldered to any one of the first conductive pad 51 and the second conductive pad 52. Further, as the solder for fixing the first mounting part 14 or 24 to the first conductive pad 51 and the second conductive pad 52, a solder having a melting point lower than that of the solder for fixing other parts may be used. Alternatively, the area or the heat capacity of the third conductive pad 53 may be increased so that the temperature of the second mounting parts 15 or 25 become lower than the temperature of the first mounting part 14 or 24. In the above description, the second leg parts 13 or 23 are described as a pair of the second leg parts that are symmetrical with respect to the center line of the width, but in the circuit protection element 10 or 20 according to the present invention, as long as the ceiling part 11 or 21, the first leg part 12 or 22, and the like can be elastically deformed by the plastic deformation of the second leg parts 13 or 23, and elastic stress can be accumulated in those parts, the number and shape of the second leg parts 13 or 23 may not be particularly limited.

EXPLANATIONS OF LETTERS OR NUMERALS

| | |
|---|---|
| 10, 20 | circuit protection element |
| 11, 21 | ceiling part |
| 11a, 21a | first end part |
| 11b, 21b | second end part |
| 11d, 12d | elastic deformation part |
| 12, 22 | first leg part |
| 13, 23 | second leg part |
| 13a, 23a | cutout |
| 13g, 13h | rectangular part (reinforcing part) |
| 13b | curved part (plastic deformation part) |
| 23b | stopper (reinforcing part) |
| 14, 24 | first mounting part |
| 15, 25 | second mounting part |
| 16, 26 | auxiliary legs part |
| 16a, 26a | contact part |
| 16b, 26b | intermediate part (plastic deformation part) |
| 16g, 26g | hook part |
| 16h, 26h | self-locking part |
| 17, 27 | engagement hole |
| 28 | connecting part (reinforcing part) |

The invention claimed is:

1. A circuit protection element formed by bending a metal plate and used in a state plastically deformed after being mounted on a circuit board, comprising:
  a ceiling part serving as a bending reference plane during forming;
  a first leg part formed by being bent, from a first end part of the ceiling part once with respect to the bending reference plane;
  a first mounting part formed by being bent, from the first leg part so as to be parallel to the ceiling part, twice with respect to the bending reference plane;

a second leg part formed by being bent, from an end part, different from the first end part, of the ceiling part, once with respect to the bending reference plane;

a second mounting part formed by being bent, from the second leg part so as to be parallel to the ceiling part, twice with respect to the bending reference plane: and a plastic deformation part set in a predetermined part of the second leg part so as to be plastically deformed by applying a load in the vicinity of a second end part opposite to the first end part, in a longitudinal direction of the circuit protection element, of the ceiling part toward a mounting surface of the circuit board.

2. The circuit protection element according to claim 1, further comprising a reinforcing part for increasing rigidity of a part of the second leg part other than the predetermined part.

3. The circuit protection element according to claim 1, further comprising a reinforcing part for maintaining parallelism and/or flatness of the second mounting part with respect to the mounting surface of the circuit board.

4. The circuit protection element according to claim 1, wherein the second leg part consists of a pair of leg parts formed by bending, inward in the width direction of the circuit protection element, a part extending in the width direction from the ceiling part, symmetrically with respect to a center line of a width of the circuit protection element.

5. The circuit protection element according to claim 1, wherein the second leg part consists of a pair of leg parts formed by bending, inward in the longitudinal direction of the circuit protection element, a part extending in the longitudinal direction from the ceiling part, symmetrically with respect to a center line of a width of the circuit protection element.

6. The circuit protection element according to claim 3, wherein a cutout is formed in the vicinity of the predetermined part of the second leg.

7. The circuit protection element according to claim 1, further comprising an auxiliary leg part bent from the vicinity of the second end part of the ceiling part toward the mounting surface side of the circuit board.

8. The circuit protection element according to claim 7, wherein a contact part contacting the mounting surface of the circuit board or a hook part engaging with a locking hole formed in the circuit board is formed at an end part of the auxiliary leg part, wherein the end part is on a side near to the mounting surface of the circuit board.

9. The circuit protection element according to claim 7, wherein a self-locking part to be engaged with a predetermined part of the circuit protection element is formed at an end part of the auxiliary leg part, wherein the end part is on a side near to the mounting surface of the circuit board.

* * * * *